United States Patent [19]
Lee et al.

[11] Patent Number: 6,133,598
[45] Date of Patent: Oct. 17, 2000

[54] SEMICONDUCTOR DEVICE WITH DIAGONAL CAPACITOR BIT LINE AND FABRICATION METHOD THEREOF

[75] Inventors: Chang-Jae Lee, Chungcheongbuk-do; Nae-Hak Park, Seoul, both of Rep. of Korea

[73] Assignee: LG Semicon Co., Ltd., Chungcheonbuk-Do, Rep. of Korea

[21] Appl. No.: 09/084,982

[22] Filed: May 28, 1998

[30] Foreign Application Priority Data

May 29, 1997 [KR] Rep. of Korea ............... 97-21679

[51] Int. Cl.[7] .................................................. H01L 27/108
[52] U.S. Cl. ........................ 257/296; 257/296; 257/303; 257/758; 257/774; 257/304; 257/305; 257/311; 257/506; 257/508; 257/520; 257/759
[58] Field of Search ............................. 257/296, 303, 257/758, 774, 304, 305, 311, 506, 508, 520, 759

[56] References Cited

U.S. PATENT DOCUMENTS

| | | | |
|---|---|---|---|
| 5,014,103 | 5/1991 | Ema | 357/41 |
| 5,140,389 | 8/1992 | Kimura et al. | 357/23.6 |
| 5,194,752 | 3/1993 | Kumagai et al. | 257/390 |
| 5,412,239 | 5/1995 | Williams | 257/343 |
| 5,714,778 | 2/1998 | Yamazaki | 257/298 |
| 5,808,365 | 9/1998 | Mori | 257/775 |
| 5,866,927 | 2/1999 | Cho et al. | 257/296 |
| 5,874,756 | 2/1999 | Ema et al. | 257/296 |

*Primary Examiner*—David Hardy
*Assistant Examiner*—Matthew E Warren
*Attorney, Agent, or Firm*—Morgan, Lewis & Bockius LLP

[57] ABSTRACT

A semiconductor device includes a semiconductor substrate having an active area including first and second impurity regions of a transistor, a gate formed over the active area of the semiconductor substrate and isolated from the semiconductor substrate, a first insulating interlayer formed on the semiconductor substrate and having first and second contact holes exposing the first and the second impurity regions, respectively, a capacitor having a storage electrode and a plate electrode, the storage electrode being connected electrically to the first impurity region through the first contact hole, a bit line contact pad connected electrically to the second impurity region through the second contact hole, a second insulating interlayer formed on the plate electrode and having a third contact hole exposing the bit line contact pad, and a bit line formed on the second insulating interlayer and in contact with the bit line contact pad through the third contact hole.

25 Claims, 5 Drawing Sheets

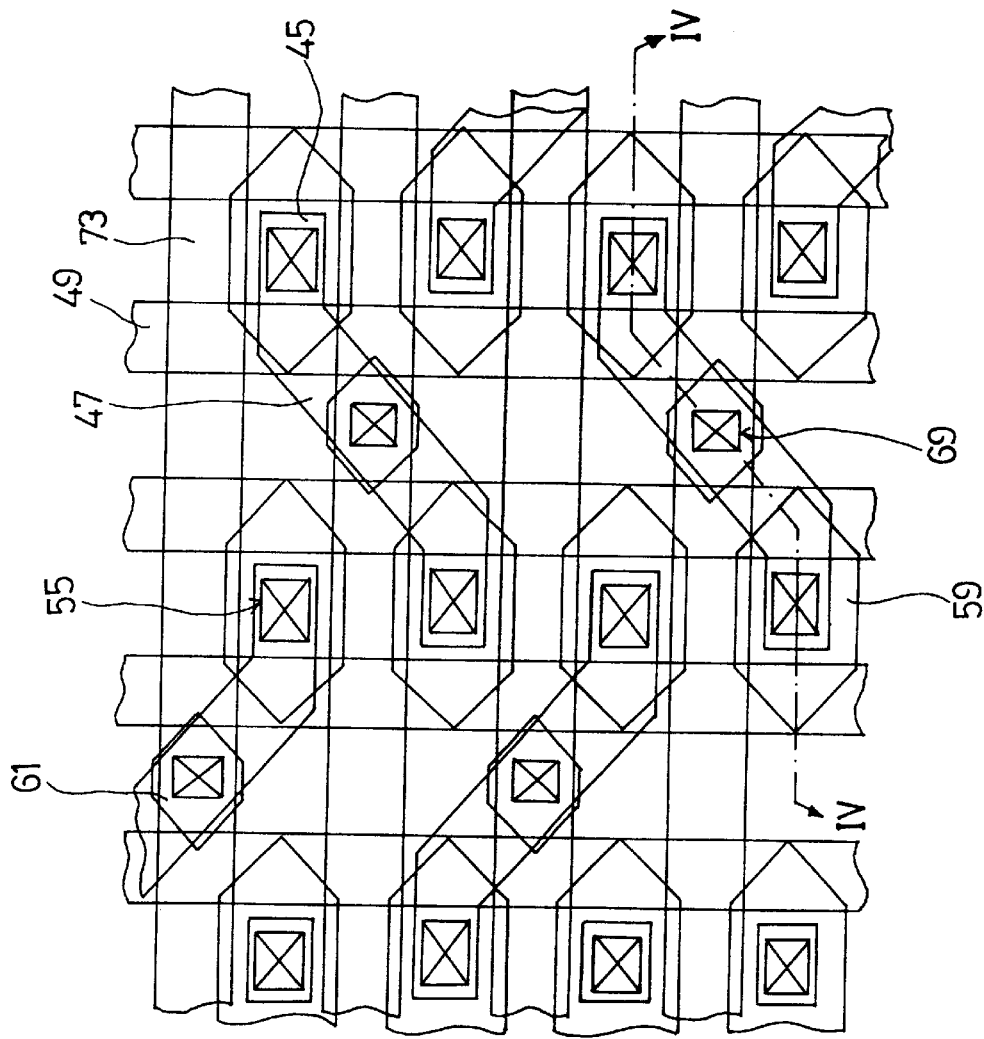

SEMICONDUCTOR DEVICE WITH DIAGONAL CAPACITOR BIT LINE AND FABRICATION METHOD THEREOF

This application claims the benefit of Korean Patent Application No. 97-21679, filed May 29, 1997, which is hereby incorporated by reference.

BACKGROUND OF THE INVENTION

1. Field of the Invention

The present invention relates to semiconductor device and a fabricating method of same, and more particularly, to a semiconductor device and a fabricating method of same having a reduced step difference between a DRAM cell region and a logic device region.

2. Discussion of the Related Art

As integration and density of semiconductor devices increases and memory cell area decreases, increasing the density of capacitors having a high charge storage capacity becomes increasingly important. In order to increase the capacitance of each capacitor, a surface area of a dielectric is increased by forming a capacitor having either a stacked structure or a threedimensional trench.

A device having both a DRAM cell and a logic device integrated on a single chip is formed by combining a known process of fabrication of the DRAM cell with a known process of fabrication of the logic device.

FIG. 1 shows a cross-sectional view of a conventional semiconductor device. A field oxide film 13 defining an active area is formed on a p-type semiconductor substrate 11. A transistor having a gate 19 and source/drain junctions 15, 17 doped heavily with N-type impurities is formed on an active area on the substrate 11. The gate 19 is surrounded by an insulating layer 21 and is isolated from the substrate 11.

A bit line 23 is formed in contact with the drain junction 17. The insulating layer 21, an insulating interlayer 24 on the bit line 23, a planarized layer 25, and an etch-stop layer 27 are formed sequentially, and then a contact hole 29 exposing the source junction 15 is formed by etching the etch-stop layer 27, the planarized layer 25 and the insulating interlayer 24. A storage electrode 31 of a capacitor is formed with doped polycrystalline silicon, and a lower portion of the storage electrode 31 is in contact with the source junction 15. The storage electrode 31 fills the contact hole 29, and an upper portion of the storage electrode 31 having a crown shape is formed on the etch-stop layer 27.

A dielectric film 37 including oxide or nitride/oxide is formed on a surface the storage electrode 31, and then a plate electrode 39 is formed on the dielectric film 37.

FIGS. 2A to 2D show cross-sectional views of a conventional process for fabricating the semiconductor device. Referring to FIG. 2A, a transistor is formed on the active area defined by the field oxide film 13 on the P-type semiconductor substrate 11. The transistor includes the gate 19 surrounded by an insulating layer 21 and isolated from the substrate 1, and source/drain junctions 15, 17. The bit line 23 is formed in contact with the drain junction 17. The insulating interlayer 24 including oxide is formed over a surface of the entire structure, and the planarized layer 25 is formed on the interlayer 24 by depositing a material having good flow characteristics, such as, for example, PSG (Phospho Silicate Glass), BSG (Boro Silicate Glass) and BPSG (Boro Phospho Silicate Glass).

An etch-stop layer 27 is formed by depositing a material having a different etch selectivity from the planarized layer 25 on the planarized layer 25. The contact hole 29 is formed using photolithography to expose the source junction 15 by removing portions of the etch-stop layer 27, the planarized layer 25 and the insulating interlayer 24.

Referring to FIG. 2B, the first polycrystalline silicon layer 31 doped with impurities is formed on the etch-stop layer 27 by CVD (chemical vapor deposition), filling up the contact hole 29 and in contact with the source junction 15. A mask pattern 33 is defined by leaving a corresponding portion on the contact hole 29 after an oxide layer has been deposited on the first polycrystalline layer 31. Furthermore, a sidewall spacer 35 is formed on lateral sides of the mask pattern 33 by etching back a nitride layer which has been deposited on both surfaces of the polycrystalline layer 31 and an exposed surface of the mask pattern 33.

Referring to FIG. 2C, the first polycrystalline silicon layer 31 is patterned into a pillar shape by etching using the mask pattern 33 and the sidewall spacers 35, exposing the etch-stop layer 27. The remaining portion of the first polycrystalline silicon layer 31 is exposed by removing the mask pattern 33. Using the sidewall spacers 35 as a mask, the exposed part of the polycrystalline silicon layer 31 is etched into a shape of a cylinder or a crown, and the etch-stop layer 27 prevents the planarized layer 25 from being removed. The sidewall spacers 35 remaining on the first polycrystalline silicon layer 31 is then removed and at the same time the exposed portion of the etch-stop layer 27 is removed, and the remaining portion of the first polycrystalline silicon layer 31 becomes the storage electrode 31.

Referring to FIG. 2D, a dielectric film 37 is formed on the surface of the storage electrode 31 (the first polycrystalline silicon layer 31). The dielectric film 37 includes one of oxide, oxide/nitride, $Ta_2O_5$, PZT ($Pb(Zr\ Ti)O_3$) and BST (($Ba\ Sr)TiO_3$). A second polycrystalline silicon layer 39 doped with impurities is formed on the dielectric film 37 to form the plate electrode 39.

The conventional semiconductor device fabricated by the above method has a Diagonal Capacitor On Bit Line structure, increasing the capacitance due to the increased area of the capacitor by forming the bit line 23 before the formation of the capacitor and also simplifying the process by decreasing an aspect ratio of the contact hole 29 which causes difficulty in contacting the bit line 23.

However, as the DRAM cell having the Diagonal Capacitor On Bit Line structure and the logic device are formed on a single chip using the conventional method, the process gets complicated.

Moreover, since the large step difference between the DRAM cell area and the logic device area causes poor resolution in the process of forming a conductive line, a fine photoresist pattern is hard to define.

SUMMARY OF THE INVENTION

Accordingly, the present invention is directed to a semiconductor device and a fabricating method thereof that substantially obviates one or more of the problems and limitations of the related art.

One object of the present invention is to provide a semiconductor device which decreases the step difference between a DRAM cell area having Diagonal Capacitor on Bit Line and a logic device area.

Another object of the present invention is to simplify a method of fabricating a semiconductor device by forming the logic device during the formation of the DRAM cell having a structure of Diagonal Capacitor on Bit Line.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention there is provided a semiconductor device including a semiconductor substrate having an active area including first and second impurity regions of a transistor, a gate formed over the active area of the semiconductor substrate and isolated from the semiconductor substrate, a first insulating interlayer formed on the semiconductor substrate and having first and second contact holes exposing the first and the second impurity regions, respectively, a capacitor having a storage electrode and a plate electrode, the storage electrode being connected electrically to the first impurity region through the first contact hole, a bit line contact pad connected electrically to the second impurity region through the second contact hole, a second insulating interlayer formed on the plate electrode and having a third contact hole exposing the bit line contact pad, and a bit line formed on the second insulating interlayer and in contact with the bit line contact pad through the third contact hole.

In another aspect of the present invention there is provided a semiconductor device including a semiconductor substrate having a diagonal type active area including first and second impurity regions of a transistor, a gate formed over the active area and isolated from the semiconductor substrate, a first insulating interlayer formed on the semiconductor substrate and having first and second contact holes exposing the first and the second impurity regions, respectively, a capacitor having a hexagonal-shaped storage electrode and a plate electrode, the storage electrode being connected electrically to the first impurity region through the first contact hole, a dielectric film interposed between the plate electrode and the storage electrode, a bit line contact pad connected electrically to the second impurity region through the second contact hole, a second insulating interlayer formed on the plate electrode and having a third contact hole exposing the bit line contact pad, and a bit line formed on the second insulating interlayer and in contact with the bit line contact pad through the third contact hole.

In another aspect of the present invention there is provided a method of fabricating a semiconductor device including the steps of defining an active area on a semiconductor substrate, forming a transistor having a gate and first and second impurity regions on the active area, forming a first insulating interlayer on the semiconductor substrate, forming first and second contact holes exposing the first and the second impurity regions, respectively, forming a storage electrode in the first contact hole and in contact with the first impurity region, and also forming a bit line contact pad in the second contact hole and in contact with the second impurity region, forming a dielectric film on the storage electrode, forming a plate electrode on the dielectric film, forming a second insulating interlayer on the plate electrode and the bit line contact pad, forming a third contact hole in the second insulating interlayer by removing a portion of the second insulating interlayer to expose the bit line contact pad, and forming a bit line on the second insulating interlayer in contact with the bit line contact pad through the third contact hole.

In another aspect of the present invention there is provided a method of fabricating semiconductor device including the steps of defining an active area having a diagonal shape on a semiconductor substrate, forming a transistor having a gate and first and second impurity regions in the active area, forming a first insulating interlayer on the semiconductor substrate, forming first and second contact holes in the first insulating interlayer and exposing the first and second impurity regions, respectively, forming a hexagonal-shaped storage electrode and a bit line contact pad in the first and second contact holes, respectively, and in contact with the first and second impurity regions, respectively, forming a dielectric film on the storage electrode, forming a plate electrode on the dielectric film, forming a second insulating interlayer on the plate electrode and the bit line contact pad, forming a third contact hole by patterning the second insulating interlayer to expose the bit line contact pad, and forming a bit line on the second insulating interlayer in contact with the bit line contact pad through the third contact hole.

In another aspect of the present invention there is provided a semiconductor device including a substrate having an active region, a drain region formed in the active region, a source region formed in the active region, a gate formed over the substrate and isolated from the substrate by an insulating layer, a first insulating interlayer formed over the gate and the insulating layer, a first contact hole formed over the source region, a second contact hole formed over the drain region, a storage electrode formed in contact with the source region in the first contact hole, a bit line contact pad formed in contact with the drain region in the second contact hole, a dielectric film formed over the storage electrode, a plate electrode formed over the dielectric film, a second insulating interlayer formed over the storage electrode, a third contact hole formed in the second insulating interlayer exposing a portion of the bit line contact pad and a bit line formed over the second insulating interlayer and in contact with the bit line contact pad through the third contact hole.

In another aspect of the present invention there is provided a method of fabricating a semiconductor device including the steps of forming an active region in a semiconductor substrate, forming a source region and a drain region in the active region, forming a gate over the active region, wherein the gate is isolated from the semiconductor substrate by an insulating layer, forming a first insulating interlayer over the insulating layer, forming a first contact hole in the insulating layer and the first insulating interlayer to expose the source region, and a second contact hole in the insulating layer and the first insulating interlayer to expose the drain region, forming a storage electrode in contact with the source region and filling the first contact hole, and forming a bit line contact pad in contact with the drain region and filling the second contact hole, forming a dielectric film over the storage electrode, forming a plate electrode over the dielectric film and over the storage electrode, forming a second insulating interlayer covering the plate electrode and at least partly covering the bit line contact pad, forming a third contact hole in the second insulating interlayer, and forming a bit line over the second insulating interlayer and in contact with the bit line contact pad.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIG. 3 shows a layout of a semiconductor device according to the present invention;

DETAILED DESCRIPTION OF THE PREFERRED EMBODIMENT

Reference will now be made in detail to the preferred embodiment of the present invention, an example of which is illustrated in the accompanying drawings.

Figure 1:
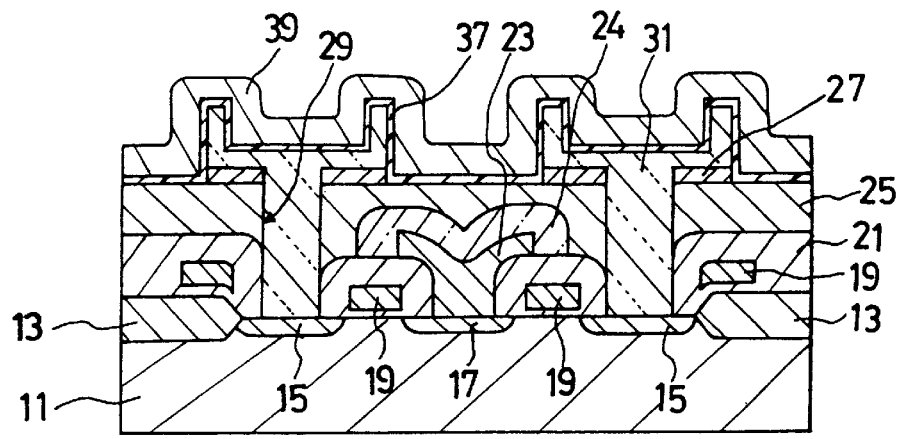
FIG. 1 shows a cross-sectional view of a conventional semiconductor device.
Figure 2A:
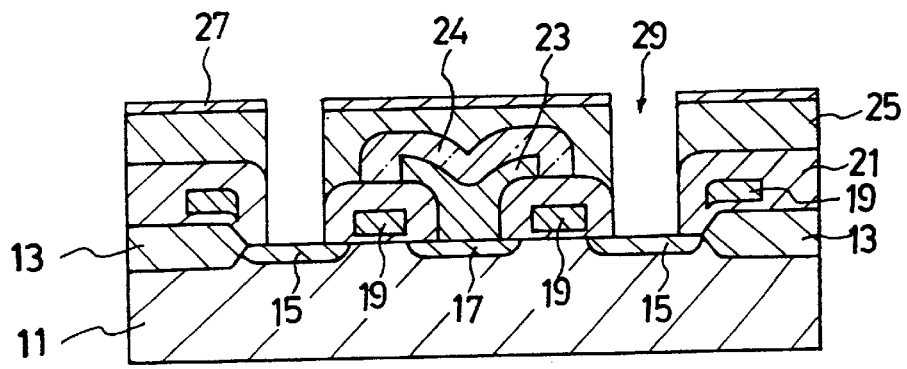
FIGS. 2A to 2D show cross-sectional views of a conventional process for fabricating the semiconductor device of FIG. 1.
Figure 2B:
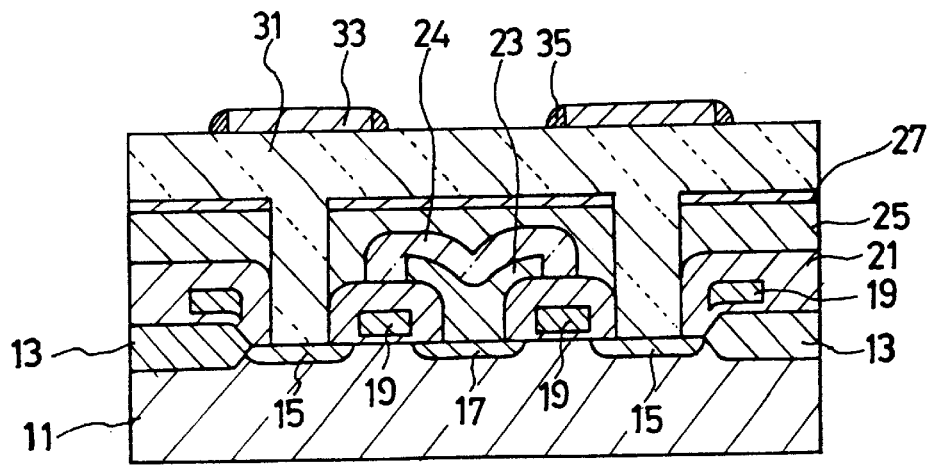
Figure 2C:
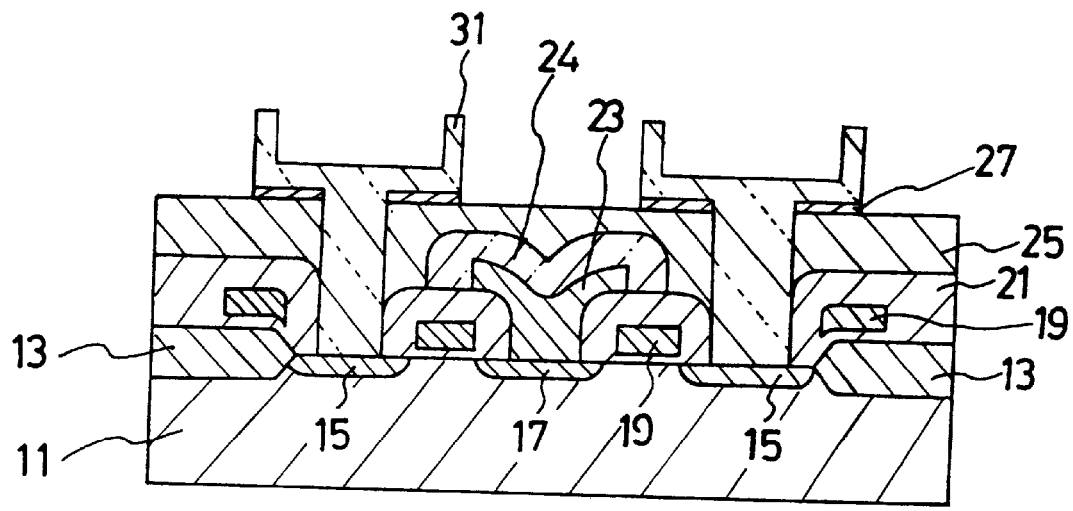
Figure 2D:
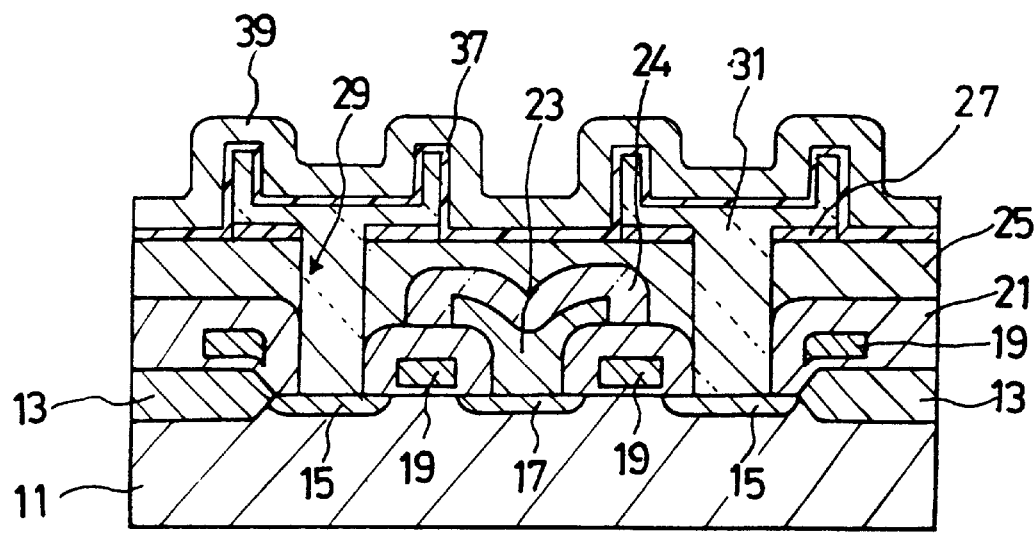
Figure 4:
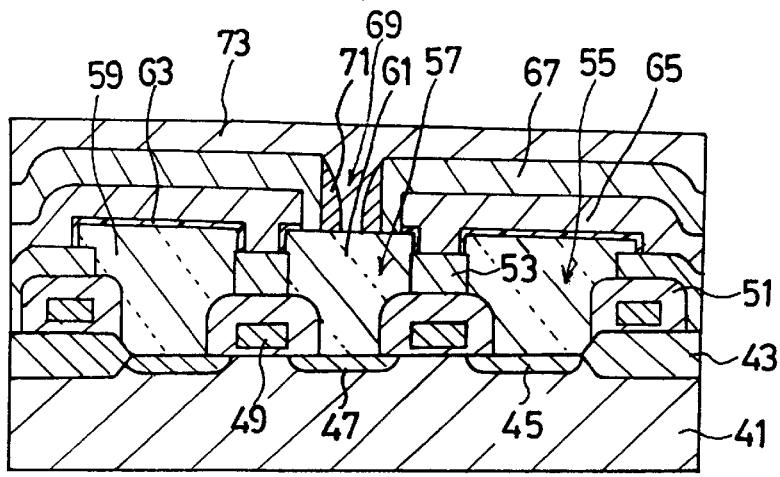
FIG. 4 shows a cross-sectional view of the semiconductor device according to the present invention along line IV—IV of FIG. 3.

FIG. 3 shows a layout of a semiconductor device of the present invention, and FIG. 4 shows a cross-sectional view of the semiconductor device of the present invention along line of IV—IV of FIG. 3.

In the semiconductor device of the present invention, a field oxide layer 43 defining an active area of a transistor, such as a diagonal type active area, is formed on a P-type semiconductor substrate 41. A transistor including a gate 49 and source/drain junctions 45, 47 doped heavily with N-type impurities is formed on the active area of the semiconductor substrate 41. The gate 49 is surrounded by an insulating layer 51 and isolated from the semiconductor substrate 41. An insulating interlayer 53 is formed on the insulating layer 51 having first and second contact holes 55, 57 for exposing the source junction 45 and the drain junction 47.

A bottom electrode 59 is formed as a storage electrode of a capacitor, and a bit line contact pad 61 is formed, wherein each bottom electrode 59 includes a conductive material, such as doped polycrystalline silicon or doped amorphous silicon, and is in contact with the source junction 45 and the drain junction 47. The bottom electrode 59 is isolated from the bit line contact pad 61. The bottom electrode 59 has a shape of a hexagon to increase the surface area. A dielectric film 63 is formed on the bottom electrode 59 by depositing a material such as oxide, oxide/nitride, $Ta_2O_5$, PZT (Pb(Zr Ti)$O_3$), and BST ((Ba Sr)TiO$_3$). A top electrode 65 is formed on the dielectric film 63 as a plate electrode of the capacitor and includes a conductive material such as doped polycrystalline silicon or doped amorphous silicon. The bit line contact pad 61 is isolated from the top electrode 65 by the dielectric film 63.

On the top electrode 65, an insulating interlayer 67 is formed of a material that is easy to planarize, such as TEOS (Tetraethyl Orthosilicate), PSG (Phospho Silicate Glass), BSG (Boro Silicate Glass) and BPSG (Boro Phospho Silicate Glass). The bit line 73 is formed in contact with the bit line contact pad 61 through a third contact hole 69 formed on the insulating interlayer 67, and sidewall spacers 71 are formed on lateral surfaces of the third contact hole 69 to isolate the top electrode 65 from the bit line 73.

As discussed above, the semiconductor device of the present invention increases capacitance by making the bottom electrode 59 not overlap the bit line contact pad 61 and have 5 the hexagonal shape due to the formation of the diagonal active area in the transistor.

FIGS. 5A to 5D show cross-sectional views of a fabrication process of the semiconductor device of the present invention.

Figure 5A:
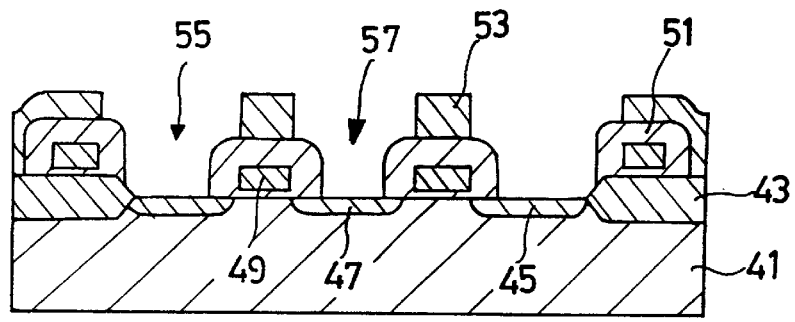
FIGS. 5A to 5D show cross-sectional views of a process for fabricating semiconductor device according to the present invention.

Referring to FIG. 5A, a transistor is formed in the active area defined by the field oxide 43 on the semiconductor substrate 41. The transistor includes the gate electrode 49 and the source/drain junctions 45, 47. The gate electrode 49 is surrounded by the insulating layer 51 and isolated from the semiconductor substrate 41. The insulating interlayer 53 is formed on the insulating layer 51 by oxide deposition using CVD, and the insulating layer 51 is deposited to a sufficient thickness so as to be flat. Then, the first and second contact holes 55, 57 are formed by patterning the insulating interlayer 53 using photolithography to expose the source/drain junctions 45, 47.

Figure 5B:
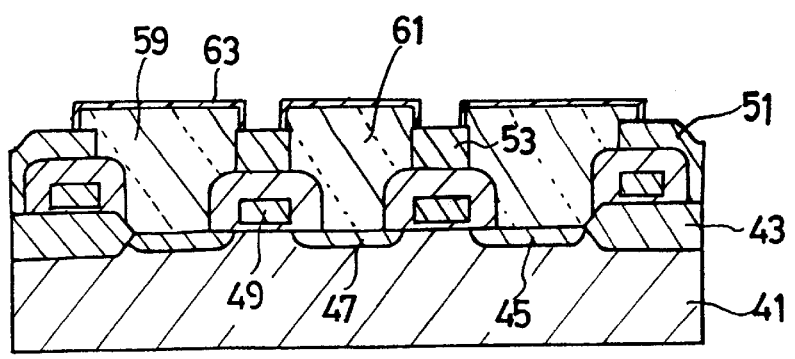

Referring to FIG. 5B, doped polycrystalline silicon is deposited on a surface of the above structure using CVD to a thickness of 1500 to 3000 Å. The bottom electrode 59 (the storage electrode), which is in contact with the source/drain junctions 45, 47 through the first and second contact holes 55, 57 and the bit line contact pad 61, are formed by patterning the doped polycrystalline silicon using photolithography to expose the insulating interlayer 53. The bottom electrode 59 has the shape of a hexagon to increase its surface area. The bottom electrode 59 and the bit line contact pad 61 may also be formed of a conductive material such as doped amorphous silicon.

The dielectric film 63 is then formed on the bottom electrode 59 by depositing one of an oxide, an oxide/nitride, $Ta_2O_5$, PZT (Pb(Zr Ti)$O_3$), and BST ((Ba Sr)TiO$_3$). The dielectric film 63 (an insulating layer) is also formed on the bit line contact pad 61.

Figure 5C:
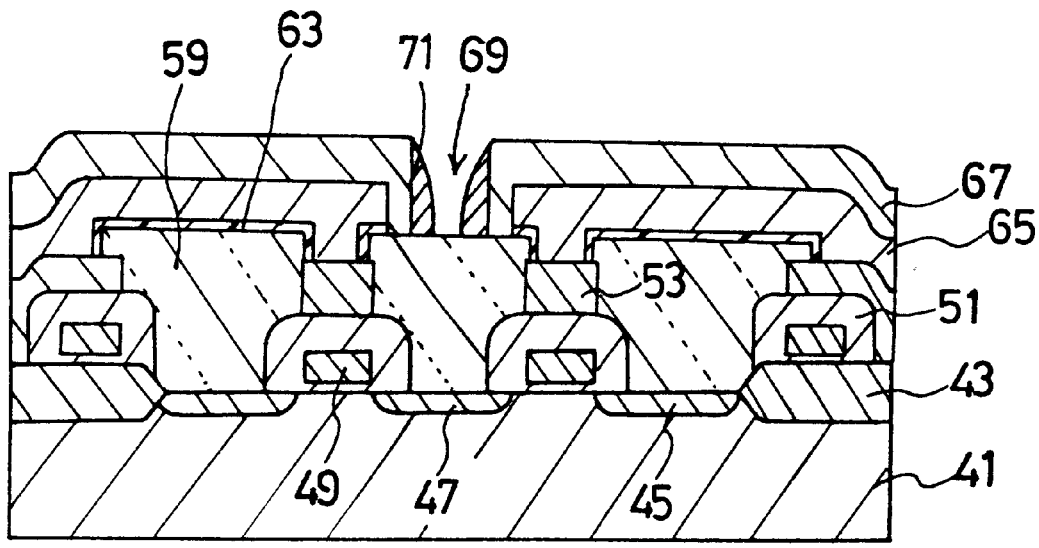

Referring to FIG. 5C, the top electrode 65 (the plate electrode of the capacitor) is formed by patterning the doped polycrystalline silicon that has been previously deposited on the dielectric film 63. The bit line contact pad 61 is separated from the top electrode 65 due to the dielectric film 63 formed on the surface of the bit line contact pad 61. Additionally, the top electrode 65 may be formed of a conductive material such as doped amorphous silicon.

The insulating interlayer 67 is formed on the top electrode 65 to a thickness of 1500–3000 A. The insulating interlayer 67 is formed of a material that can be easily planarized, such as PSG (Phospho Silicate Glass), BSG (Boro Silicate Glass), BPSG (Boro Phospho Silicate Glass) and TEOS (Tetraethyl Orthosilicate).

A third contact hole 69 is formed by patterning the insulating interlayer 67 using photolithography until the bit line contact pad 61 is exposed. The sidewall spacers 71 are formed on lateral surfaces of the third contact hole 69 to prevent the top electrode 65 from being exposed by etching back the oxide which has been formed on the insulating interlayer 67 using Reactive Ion Etching.

Figure 5D:
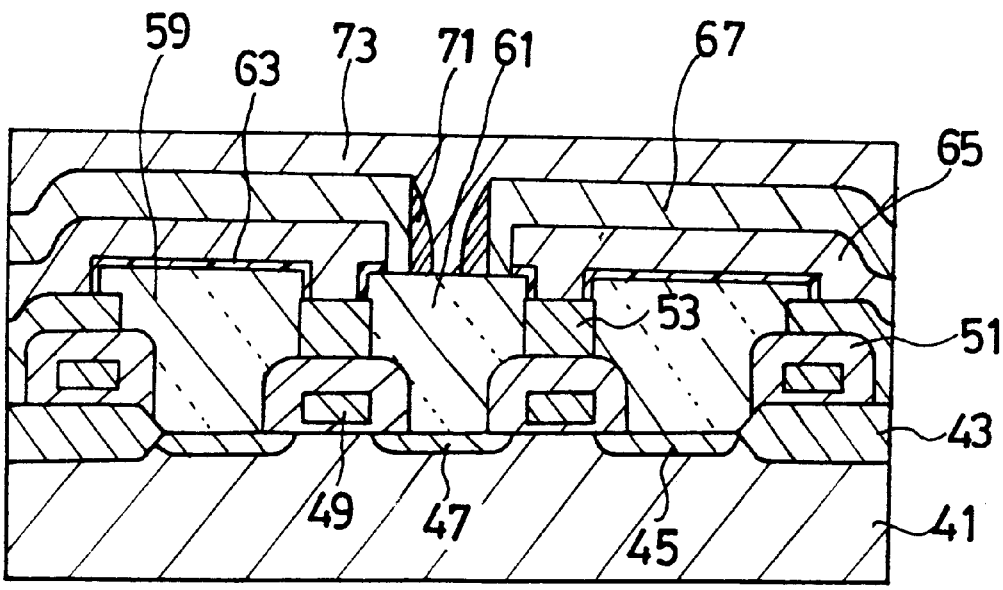

Referring FIG. 5D, a conductive metal such as aluminum is deposited on the insulating interlayer 67 to contact the bit line contact pad 61 through the third contact hole 69. A bit line 73 contacting the bit line contact pad 61 through the third contact hole 69 is formed by patterning the conductive metal. The sidewall spacers 71 prevent the bit line 73 from being electrically connected to the top electrode 65, and a first metal line can be formed in a logic device area after the bit line 73 is formed by patterning the conductive metal.

As discussed above, the semiconductor device of the present invention increases capacitance of the DRAM capacitor because the bottom electrode 59 is formed so as to not overlap the bit line contact pad 61. The bottom electrode 59 has a hexagonal shape due to the formation of the diagonal active area in the transistor.

Moreover, compared to having a capacitor over the bit line 73, the semiconductor device of the present invention having the CUB (capacitor under bit line) structure has a reduced step difference between DRAM cell area.

Also, the first metal line of the logic device can be formed simultaneously with the bit line 73 of the DRAM cell. Therefore, the present invention decreases the step difference between the DRAM cell area having Diagonal Capacitor on Bit Line and the logic device area. Furthermore the present invention provides a method of fabricating a semiconductor device in which the fabrication steps are simplified by forming the logic device during the formation of the DRAM cell.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A semiconductor device comprising:
   a semiconductor substrate having an active area in an upper portion of the semiconductor substrate, the active area including first and second impurity regions of a transistor;
   a gate formed over the active area of the semiconductor substrate and isolated from the semiconductor substrate;
   a first insulating interlayer formed on the semiconductor substrate and having first and second contact holes exposing the first and the second impurity regions, respectively;
   a capacitor having a storage electrode and a plate electrode, the storage electrode being connected electrically to the first impurity region through the first contact hole;
   a bit line contact pad having a lower surface connected electrically to the second impurity region through the second contact hole;
   a second insulating interlayer formed on the plate electrode and having a third contact hole exposing the bit line contact pad;
   sidewall spacers formed directly over an upper surface of the bit line contact pad and at lateral sides of the third contact hole; and
   a bit line formed on the second insulating interlayer and in contact with the bit line contact pad through the third contact hole,
   wherein the sidewall spacers are in contact only with the bit line contact pad, the bit line and the second insulating interlayer.

2. The semiconductor device of claim 1, wherein the active area has a diagonal shape.

3. The semiconductor device of claim 1, wherein the storage electrode has a hexagonal shape.

4. The semiconductor device of claim 1, wherein the capacitor includes a Pb(Zr Ti)O$_3$ dielectric film.

5. The semiconductor device of claim 1, wherein the capacitor includes a (Ba Sr)TiO$_3$ dielectric film.

6. The semiconductor device of claim 1, wherein the plate electrode includes doped polycrystalline silicon.

7. The semiconductor device of claim 1, wherein the plate electrode includes doped amorphous silicon.

8. The semiconductor device of claim 1, wherein the second insulating interlayer includes Tetraethyl Orthosilicate.

9. The semiconductor device of claim 1, wherein the second insulating interlayer includes Phospho Silicate Glass.

10. The semiconductor device of claim 1, wherein the second insulating interlayer includes Boro Silicate Glass.

11. The semiconductor device of claim 1, wherein the second insulating interlayer includes Boro Phospho Silicate Glass.

12. The semiconductor device of claim 1, wherein the storage electrode is between 1500 and 3000 angstroms thick.

13. The semiconductor device of claim 1, wherein the second insulating interlayer is between 1500 and 3000 angstroms thick.

14. The semiconductor device of claim 1,
   wherein the capacitor includes a Pb(Zr Ti)O$_3$ dielectric film, and
   wherein the second insulating interlayer includes Boro Phospho Silicate Glass.

15. The semiconductor device of claim 1,
   wherein the capacitor includes a Pb(Zr Ti)O$_3$ dielectric film, and
   wherein the second insulating interlayer includes Boro Silicate Glass.

16. The semiconductor device of claim 1,
   wherein the capacitor includes a Pb(Zr Ti)O$_3$ dielectric film, and
   wherein the second insulating interlayer includes Phospho Silicate Glass.

17. The semiconductor device of claim 1,
   wherein the capacitor includes a (Ba Sr)TiO$_3$ dielectric film, and
   wherein the second insulating interlayer includes Boro Phospho Silicate Glass.

18. The semiconductor device of claim 1,
   wherein the capacitor includes a (Ba Sr)TiO$_3$ dielectric film, and
   wherein the second insulating interlayer includes Boro Silicate Glass.

19. The semiconductor device of claim 1,
   wherein the capacitor includes a (Ba Sr)TiO$_3$ dielectric film, and
   wherein the second insulating interlayer includes Phospho Silicate Glass.

20. The semiconductor device of claim 1,
   wherein the capacitor includes a Pb(Zr Ti)O$_3$ dielectric film, and
   wherein the storage electrode is between 1500 and 3000 angstroms thick.

21. The semiconductor device of claim 1,
   wherein the capacitor includes a (Ba Sr)TiO$_3$ dielectric film, and
   wherein the storage electrode is between 1500 and 3000 angstroms thick.

22. A semiconductor device comprising:
   a semiconductor substrate having a diagonal type active area in an upper portion of the semiconductor substrate, the active area including first and second impurity regions of a transistor;

a gate formed over the active area and isolated from the semiconductor substrate;

a first insulating interlayer formed on the semiconductor substrate and having first and second contact holes exposing the first and the second impurity regions, respectively;

a capacitor having a hexagonal-shaped storage electrode and a plate electrode, the storage electrode being connected electrically to the first impurity region through the first contact hole;

a dielectric film interposed between the plate electrode and the storage electrode;

a bit line contact pad having a lower surface connected electrically to the second impurity region through the second contact hole;

a second insulating interlayer formed on the plate electrode and having a third contact hole exposing the bit line contact pad;

sidewall spacers formed directly over an upper surface of the bit line contact pad and at lateral sides of the third contact hole; and a bit line formed on the second insulating interlayer and in contact with the bit line contact pad through the third contact hole, wherein the sidewall spacers are in contact only with the bit line contact pad, the bit line and the second insulating interlayer.

23. A semiconductor device comprising:

a substrate having an active region in an upper portion of the substrate;

a drain region formed in the active region;

a source region formed in the active region;

a gate formed over the substrate and isolated from the substrate by an insulating layer;

a first insulating interlayer formed over the gate and the insulating layer;

a first contact hole formed over the source region;

a second contact hole formed over the drain region;

a storage electrode formed in contact with the source region in the first contact hole;

a bit line contact pad having a lower surface in contact with the drain region in the second contact hole;

a dielectric film formed over the storage electrode;

a plate electrode formed over the dielectric film;

a second insulating interlayer formed over the storage electrode;

a third contact hole formed in the second insulating interlayer exposing a portion of the bit line contact pad;

a bit line formed over the second insulating interlayer and in contact with the bit line contact pad through the third contact hole; and sidewall spacers formed directly over an upper surface of the bit line contact pad and at lateral sides of the third contact hole, wherein the sidewall spacers are in contact only with the bit line contact pad, the bit line and the second insulating interlayer.

24. The semiconductor device of claim 23, wherein the active area has a diagonal shape.

25. The semiconductor device of claim 23, wherein the storage electrode has a hexagonal shape.

* * * * *